(12) United States Patent
Kawa et al.

(10) Patent No.: US 12,408,563 B1
(45) Date of Patent: Sep. 2, 2025

(54) SUPERCONDUCTING ANTI-FUSE BASED FIELD PROGRAMMABLE GATE ARRAY

(71) Applicant: Synopsys, Inc., Mountain View, CA (US)

(72) Inventors: Jamil Kawa, Campbell, CA (US); Stephen Robert Whiteley, Sunnyvale, CA (US); Eric M. Mlinar, Santa Clara, CA (US); Robert Freeman, Menlo Park, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 17/410,183

(22) Filed: Aug. 24, 2021

Related U.S. Application Data

(60) Provisional application No. 63/069,374, filed on Aug. 24, 2020.

(51) Int. Cl.
*H10N 69/00* (2023.01)
*H01L 23/525* (2006.01)
*H01L 23/532* (2006.01)

(52) U.S. Cl.
CPC ......... *H10N 69/00* (2023.02); *H01L 23/5254* (2013.01); *H01L 23/53285* (2013.01)

(58) Field of Classification Search
CPC  H01L 27/18; H01L 23/5254; H01L 23/53285
USPC ....................................................... 257/530
See application file for complete search history.

(56) References Cited

U.S. PATENT DOCUMENTS

| | | | | |
|---|---|---|---|---|
| 5,302,546 | A | * | 4/1994 | Gordon ............... H01L 23/5252 438/467 |
| 5,550,400 | A | * | 8/1996 | Takagi ................. G11C 17/165 257/530 |
| 6,509,209 | B1 | * | 1/2003 | Shroff ................. H01L 23/5252 438/467 |
| 2003/0034794 | A1 | * | 2/2003 | Kameda ............. H03K 19/1954 326/1 |

(Continued)

FOREIGN PATENT DOCUMENTS

| CN | 1211083 | * | 3/1999 |
|---|---|---|---|
| CN | 1695232 | * | 11/2005 |

(Continued)

*Primary Examiner* — Sheng-Bai Zhu
(74) *Attorney, Agent, or Firm* — Laxman Sahasrabuddhe; Park, Vaughan, Fleming & Dowler LLP

(57) ABSTRACT

A superconducting anti-fuse based field programmable gate array (FPGA) may include a first set of superconducting passive transmission lines, a second set of superconducting passive transmission lines, and at least one anti-fuse located at an intersection of a first superconducting passive transmission line from the first set of superconducting passive transmission lines and a second superconducting passive transmission line from the second set of superconducting passive transmission lines. A first terminal of the anti-fuse may be electrically connected to the first superconducting passive transmission line and a second terminal of the anti-fuse may be electrically connected to the second superconducting passive transmission line. The anti-fuse may transition from a first state having a non-zero resistance to a second state having a zero resistance below a critical temperature.

18 Claims, 5 Drawing Sheets

(56) References Cited

U.S. PATENT DOCUMENTS

| | | | | |
|---|---|---|---|---|
| 2006/0255987 A1* | 11/2006 | Nagasawa | ............... | G11C 11/44 |
| | | | | 341/87 |
| 2008/0122483 A1* | 5/2008 | Shiao | ............... | H03K 19/17736 |
| | | | | 326/38 |
| 2011/0317324 A1* | 12/2011 | Clevenger | ......... | H01L 31/02021 |
| | | | | 361/103 |
| 2012/0129301 A1* | 5/2012 | Or-Bach | ............. | H01L 27/1203 |
| | | | | 438/129 |
| 2019/0131685 A1* | 5/2019 | Olivadese | .............. | B82Y 20/00 |
| 2020/0028512 A1* | 1/2020 | Reohr | ................ | H03K 19/1952 |

FOREIGN PATENT DOCUMENTS

| | | | |
|---|---|---|---|
| CN | 110311662 | * | 10/2019 |
| DE | 112012002442 | * | 3/2014 |
| JP | H0275125 | * | 3/1990 |
| JP | H08236821 | * | 9/1996 |
| JP | H0927548 | * | 1/1997 |
| JP | H10284604 | * | 10/1998 |
| WO | WO 0110027 | * | 2/2001 |
| WO | WO 2009044237 | * | 4/2009 |

* cited by examiner

SUPERCONDUCTING ANTI-FUSE BASED FIELD PROGRAMMABLE GATE ARRAY

RELATED APPLICATION

This application claims the benefit of U.S. Provisional Application Ser. No. 63/069,374, filed on 24 Aug. 2020, the contents of which are herein incorporated by reference in their entirety for all purposes.

TECHNICAL FIELD

The present disclosure relates to integrated circuit (IC) design. More specifically, the present disclosure relates to superconducting anti-fuse based field programmable gate array (FPGA).

BACKGROUND

An increasing demand for computing and storage capacity has fueled an increase in the size and complexity of IC designs. Superconducting electronics (SCE) is a technology that may help meet future computing and storage demands.

SUMMARY

Embodiments described herein may feature a superconducting anti-fuse based FPGA, which may include a first set of superconducting passive transmission lines (PTLs), a second set of superconducting PTLs, and at least one anti-fuse located at an intersection of a first superconducting passive transmission line (PTL) from the first set of superconducting PTLs and a second superconducting PTL from the second set of superconducting PTLs. A first terminal of the anti-fuse may be electrically connected to the first superconducting PTL and a second terminal of the anti-fuse may be electrically connected to the second superconducting PTL. In some embodiments, the first set of superconducting PTLs, the second set of superconducting PTLs, and the at least one anti-fuse may be used to electrically connect inputs and outputs of superconducting circuitry.

The anti-fuse may have a first state with a non-zero resistance and a second state with a zero resistance below a critical temperature. In some embodiments, the anti-fuse can transition from the first state to the second state but cannot transition from the second state to the first state. In some embodiments, the anti-fuse can transition from the first state to the second state, and from the second state to the first state. In some embodiments, the anti-fuse may transition from the first state to the second state when the anti-fuse is exposed to electromagnetic radiation having an intensity greater than a threshold intensity. In some embodiments, the anti-fuse may transition from the first state to the second state when a voltage greater than a threshold voltage is applied across the anti-fuse. In some embodiments, the anti-fuse may transition from the first state to the second state when a current greater than a threshold current is passed through the anti-fuse.

In some embodiments, the anti-fuse may include two superconducting structures separated by a dielectric. Specifically, the two superconducting structures may be made of: niobium, lead, aluminum, sodium-lead alloy, tantalum carbide, niobium carbide, lead-arsenic alloy, lead-tin-bismuth alloy, lead-arsenic-bismuth alloy, lead-bismuth-antimony alloy, magnesium di-boride, niobium-tin, a high temperature superconducting material (e.g., yttrium barium copper oxide), or any other material that exhibits superconductive behavior below a given critical temperature.

In some embodiments, the superconducting anti-fuse based FPGA may include a set of superconducting electronics modules arranged in rows. In some embodiments, the rows may be separated by channels. In some embodiments, a superconducting electronics module may include one or more of: a PTL receiver, a PTL driver, a splitter, combinational logic that uses superconducting electronics, sequential logic that uses superconducting electronics, Josephson Junction (JJ) based superconducting quantum interference (SQUID) devices, and JJ based memory arrays.

In some embodiments, the superconducting anti-fuse based FPGA may include a complementary metal-oxide-semiconductor (CMOS) circuit. In some embodiments, the CMOS circuit may be a memory circuit. In some embodiments, the CMOS circuit may be used for transitioning the anti-fuse from a first state having a non-zero resistance to a second state having a zero resistance below a critical temperature.

In some embodiments, the superconducting anti-fuse based FPGA may include a circuit constructed using III-V semiconductor technology or heterojunction bipolar transistor technology.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
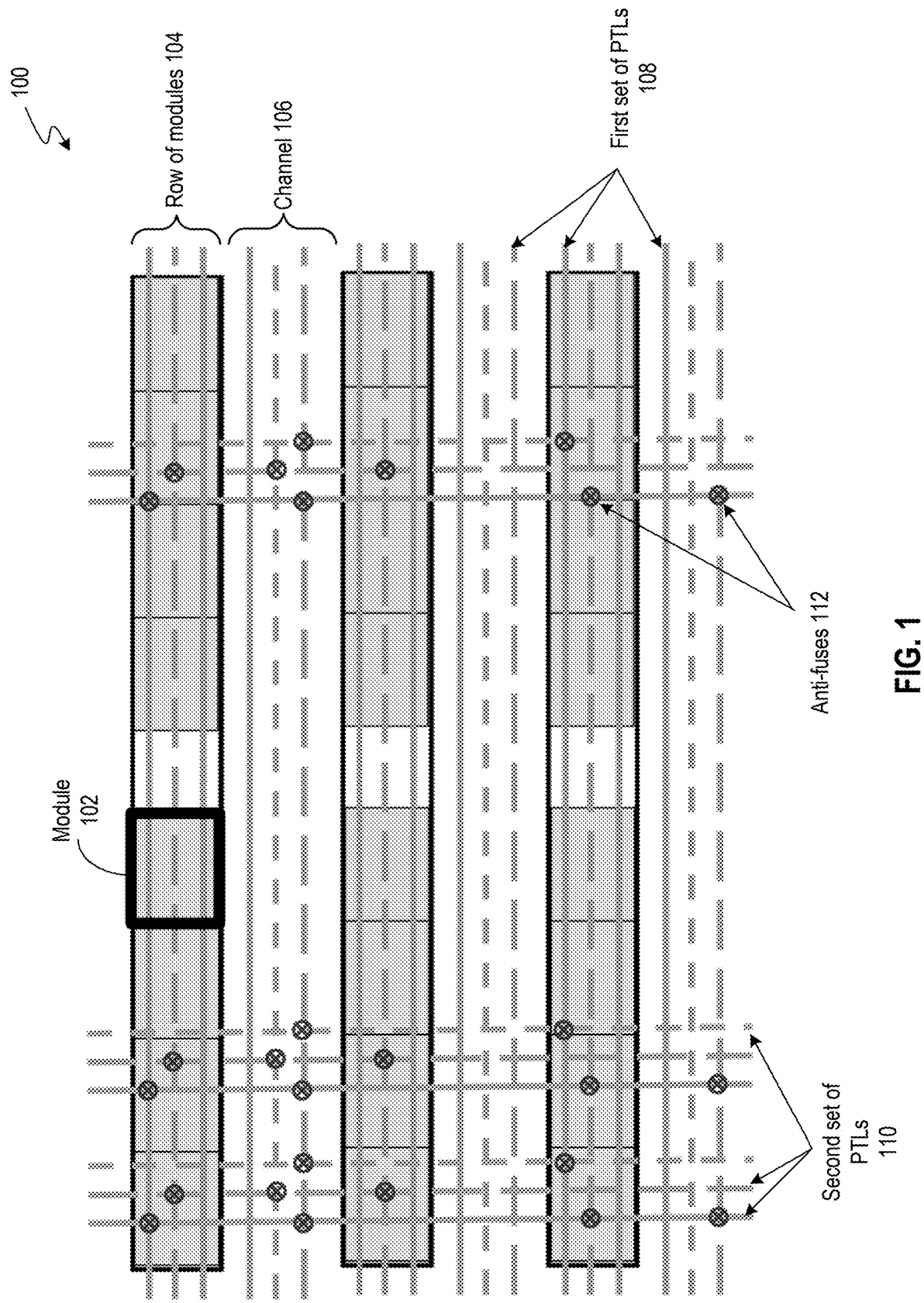
FIG. 1 illustrates a superconducting anti-fuse based FPGA in accordance with some embodiments disclosed herein.

SCE generally refers to electronic circuits that may include active and passive components, and that are designed to be operated below a critical temperature, where at least some of the components exhibit superconducting behavior. Some SCE components are based on single flux quantum (SFQ) technology, which relies on the quantum mechanical quantization of magnetic flux. Although SFQ technology may come in many flavors, all SFQ technologies are based on flux storage and transmission, and use pulses emitted by Josephson Junctions.

When a JJ emits a voltage pulse, it may induce a single quantum of magnetic flux into a superconducting inductor that is electrically connected to the JJ. Some SFQ devices may achieve pulse widths close to a picosecond. In SFQ technology, logic states may be transmitted between SFQ logic gates by propagating SFQ pulses, which may be generated by JJs.

A JJ may include two superconducting structures separated by a non-superconducting structure. In this disclosure, the non-superconducting structure that separates two superconducting structures may be referred to as a junction. In a JJ, the junction may support a current that may flow indefinitely without any voltage being applied across the junction. Examples of superconducting materials that may be used to construct a superconducting structure include, but are not limited to, aluminum (Al), niobium (Nb), and lead (Pb). In some embodiments, a non-superconducting structure may be a thin insulating tunnel barrier that is made of aluminum/ aluminum oxide (Al/AlOx). In other embodiments, a non-superconducting structure may be made of a conducting material, such as silver (Ag), copper (Cu), or gold (Au), that does not exhibit superconductivity at low temperatures. In yet other embodiments, a non-superconducting structure may be a multilayered structure that may include one or more magnetic, non-magnetic, insulating, conducting, or ferromagnetic layers. In some embodiments, the non-superconducting structure is made of a superconducting material that has defects (which may have been introduced into the superconducting material by using a suitable technique, e.g., an electron beam), which prevent superconductivity at low temperatures.

In some approaches, SFQ pulses can be transmitted between SFQ logic gates by using a Josephson transmission line (JTL), which includes a series of superconducting inductors with a JJ connected to ground at each connection between two adjacent superconducting inductors. One alternative to using a JTL is to use a PTL. A PTL is a stripline structure that has an extremely low power loss because the stripline structure is superconductive. However, a PTL uses a driver circuit to drive the PTL with a non-SFQ voltage pulse, and a receiver circuit to convert the pulse received over the PTL back into an SFQ pulse.

SCE designs based on interoperability of more than one SFQ technology is a promising scheme with a potential of delivering superior results in power, speed, and area. However, it is difficult to automate the design of such mixed technology SCE circuits using existing electronic design automation (EDA) applications. SCE designs that are based on dual-rail technology (which asserts two separate signals for encoding a "1" and a "0") double the total amount of routing resources needed, which makes it difficult to automate the design of such dual-rail SCE circuits using EDA applications.

Because SCE needs to be operated near absolute zero temperatures (a few m° K to 4° K), SCE chips are typically not produced in large volumes and the non-recurring engineering (NRE) cost and turn-around-time opportunity cost are amortized over a small volume of chips, which makes SCE an expensive technology, and which reduces the commercial investment in this technology.

Custom designed SCE circuits may not suffer from the above drawbacks. However, custom designed SCE circuits may be practical for small designs but are not practical for designs that include more than a few thousand gates and are not suitable for generic synthesized/optimized register transfer level (RTL) circuits. Also, the NRE cost associated with each custom designed SCE circuit remains the same.

Embodiments described herein overcome the above-mentioned problems by featuring a superconducting anti-fuse-based FPGA design that can realize the best of both worlds. Specifically, some embodiments feature a configurable module that has custom compactness and has PTL drivers/ receivers at module level I/Os only. In some embodiments, several modules or families of modules may be optimized for different applications, resulting in a set of superconducting anti-fuse based FPGAs that are configurable and optimized for different applications.

Some embodiments may feature pre-laid-out PTLs, which may make timing convergence and management easier. Pre-laid out PTLs may also make clock tree network realization and power delivery network realization manageable. Finally, pre-laid-out PTLs may make realizing dual-rail routing more manageable than an automated routing scheme. In this manner, embodiments disclosed herein may make NRE costs more palatable by splitting the costs over many designs. Also, in embodiments described herein the design turnaround time (TAT) for an engineering change order (ECO) flow is typically orders of magnitudes faster than a custom NRE flow.

FIG. 1 illustrates a superconducting anti-fuse based FPGA in accordance with some embodiments disclosed herein.

Superconducting anti-fuse based FPGA 100 may include a first set of superconducting PTLs 108 (e.g., horizontal PTLs) and a second set of superconducting PTLs (e.g., vertical PTLs). The first set of superconducting PTLs may be along a first direction and the second set of superconducting PTLs may be along a second direction. The first direction maybe perpendicular to the second direction. At least one anti-fuse may be located at an intersection of a first superconducting PTL from the first set of PTLs and a second superconducting PTL from the second set of superconducting PTLs (e.g., anti-fuses 112). A first terminal of an anti-fuse may be electrically connected to the first superconducting PTL and a second terminal of the anti-fuse may be electrically connected to the second superconducting PTL.

Superconducting anti-fuse based FPGA 100 may include multiple rows of modules (e.g., row of modules 104) that may be separated by channels (e.g., channel 106). Each module (e.g., module 102) may include SCE circuitry that may implement a specific functionality. In some embodiments, the superconducting anti-fuse based FPGA 100 may not include any channels.

Channels may refer to areas in the superconducting anti-fuse based FPGA that do not contain modules and that are used for routing connections between modules. A channel may include PTLs in the first and second directions with anti-fuses at the intersections of PTLs. The PTLs may be segmented with different lengths, e.g., from full-core span segments to small local segments.

An anti-fuse may have a first state having a non-zero resistance and a second state having a zero resistance below a critical temperature. Depending on the type of material and construction used, the anti-fuse may transition from the first state to the second state when (1) the anti-fuse is exposed to electromagnetic radiation having an intensity greater than a threshold intensity, (2) a voltage greater than a threshold voltage is applied across the anti-fuse, or (3) a current greater than a threshold current is passed through the anti-fuse. Connectivity between different modules and different SCE circuit blocks within a module may be realized by selectively causing anti-fuses to transition to the second state.

Figure 2:
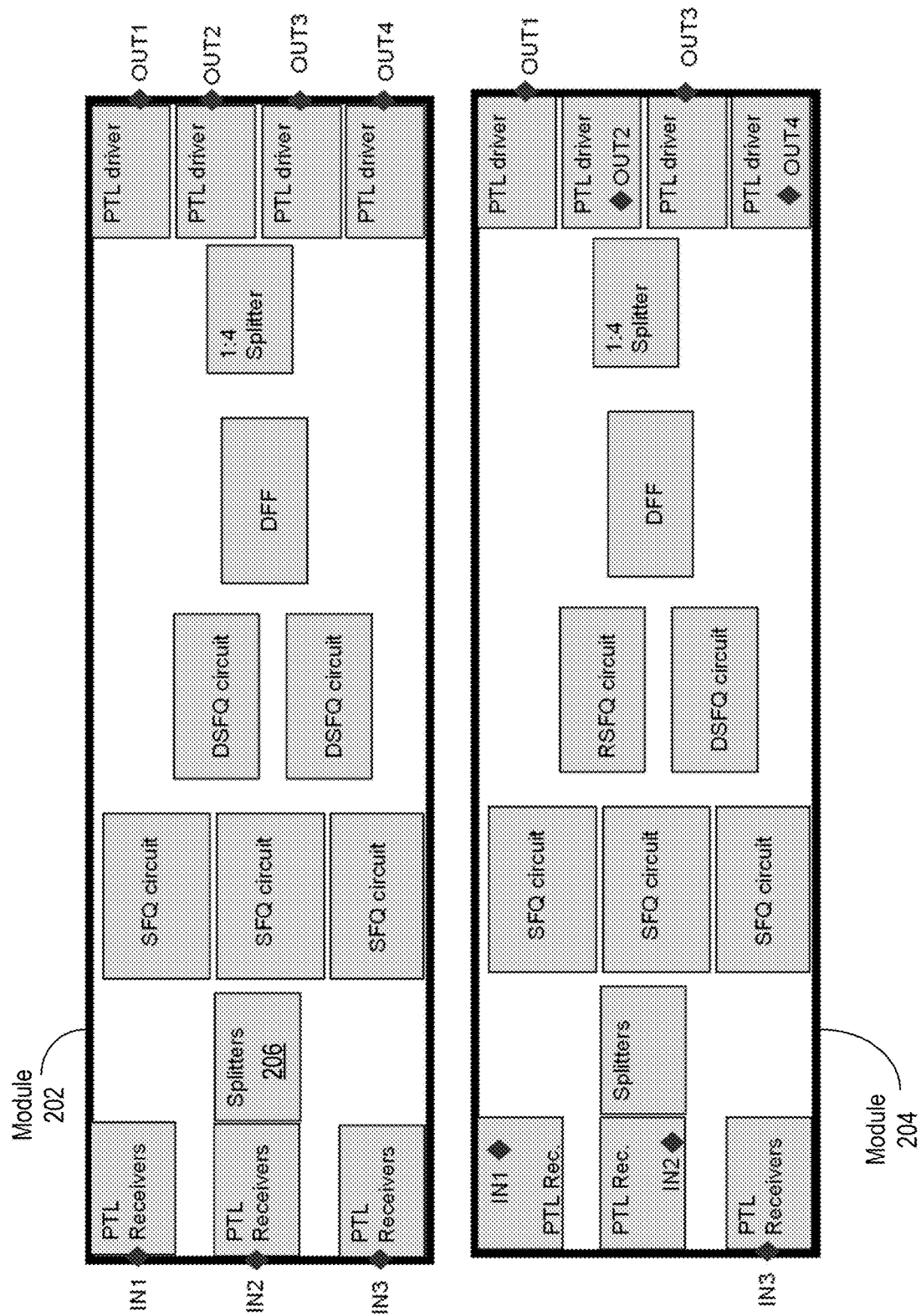
FIG. 2 illustrates a module in accordance with some embodiments described herein.

FIG. 2 illustrates a module in accordance with some embodiments described herein.

Module 202 includes three input terminals (IN1, IN2, and IN3), four output terminals (OUT1, OUT2, OUT3, and OUT4), and multiple SCE circuit blocks that may use different SCE technologies. Module 202 may include inbuilt PTL receivers connected to the input terminals, and inbuilt PTL drivers connected to the output terminals. As shown in FIG. 2, module 202 may also include splitters that may be used to overcome any fanout limitations of SCE circuit blocks.

In module 202, the input terminals and the output terminals are at the module boundary. However, modules are not limited to having terminals at the boundaries. For example, module 204 includes three input terminals (IN1, IN2, and IN3), four output terminals (OUT1, OUT2, OUT3, and OUT4), and multiple SCE circuit blocks that may use different SCE technologies. Unlike module 202, some of the input terminals (IN1 and IN2) and some of the output terminals (OUT2 and OUT4) of module 204 are not at the module boundary. The connectivity within a module is configurable, and one or more SCE circuit blocks within a module may be bypassed. Specifically, the PTLs (e.g., first set of PTLs 108 and the second set of PTLs 110 in FIG. 1) and anti-fuses (e.g., 112) may be used to create connections between SCE circuit blocks within a module and may be used to bypass one or more SCE circuit blocks (e.g., a PTL receiver or a PTL driver may be bypassed by configuring the appropriate anti-fuses).

Some embodiments feature a configurable anti-fuse enabled routing strategy that has the speed and power advantages of using PTL transmission lines for interconnects, power delivery networks, and clock tree networks. Splitters (1:n) in a module, e.g., splitter 206 in module 202, may be used to overcome fan-out limitation of SFQ circuits.

Different modules may be targeted to different classes of applications and may use different SFQ technologies. Examples of different types of modules include, but are not limited to, modules targeted for (1) the construction of generic state machines for general computing purposes, (2) modules for signal processing applications, e.g., analog-digital converters (ADCs), multiply-accumulate modules (MACs), and other MSI elements, (3) modules for radio-frequency (RF)/software radio applications, e.g., mixed-mode components such as mixers/detectors, etc. (4) modules for SQUID systems, e.g., magnetometers and magnetometer control circuitry which are used in metrology, (5) modules for performing quantum computing, e.g., modules containing qubit/transmon control circuitry, both RF and direct current (DC), and (6) modules for voltage reference applications & waveform generators that are quantum accurate.

A module may include circuitry belonging to one or more types or families of SCE technology, e.g., module 204 includes SFQ circuitry, RSFQ circuitry, and DSFQ circuitry. Examples of SCE technologies that may be used in modules include, but are not limited to, reciprocal quantum logic (RQL), dynamic SFQ (DSFQ), dual-rail SFQ, energy efficient rapid SFQ (ERSFQ), and adiabatic quantum-flux-parametron (AQFP).

A significant design effort may be used when designing AQFP circuits. Specifically, AQFP circuits may require careful balancing and construction of a 4-phase (or more) clock network. Embodiments described herein may be used for pre-layout and construction of 4-phase (or more) clocked AQFP circuits.

Figure 3:
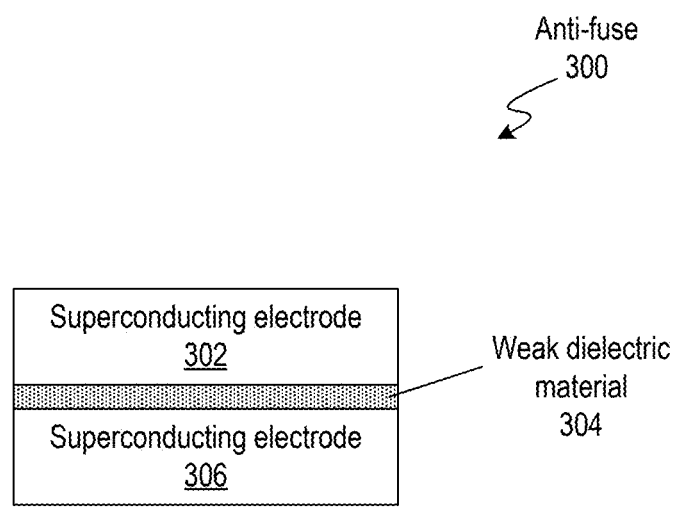
FIG. 3 illustrates a cross-section of an anti-fuse in accordance with some embodiments described herein.

FIG. 3 illustrates a cross-section of an anti-fuse in accordance with some embodiments described herein.

Anti-fuse 300 may include superconducting electrodes 302 and 306 separated by a weak dielectric material 304. When anti-fuse 300 is initially created, it is in the "off" state, i.e., weak dielectric material 304 acts as an insulator between superconducting electrodes 302 and 306. Depending on the material and construction that is used to create anti-fuse 300, weak dielectric material 304 can be turned into a superconductor, thereby creating a superconducting path between superconducting electrodes 302 and 306. This is the "on" state of anti-fuse 300. In some embodiments, the anti-fuse material (e.g., the material of weak dielectric material 304) may be a composite material.

Superconducting electrodes 302 and 306 may be constructed using a superconducting material that (1) can be introduced using chemical vapor deposition (CVD), (2) can "fuse" into a weak insulating dielectric, and (3) can form superconductive filaments. Superconducting electrodes 302 and 306 may be constructed using superconducting materials that include, but are not limited to, niobium (Nb), lead (Pb), aluminum (Al), sodium-lead (Na—Pb) alloy (Tc=7.2° K), tantalum carbide TaC (Tc=9.2° K), niobium carbide NbC. (Tc=10.1° K), lead-arsenic (Pb—As) alloy (Tc=8.4° K), lead-tin-bismuth (Pb—Sn—Bi) alloy (Tc=8.5° K), lead-arsenic-bismuth (Pb—As—Bi) alloy (Tc=9.0° K), and lead-bismuth-antimony (Pb—Bi—Sb) alloy (Tc=8.9° K), magnesium di-boride ($MgB_2$) (Tc=39° K), and niobium-tin ($Nb_3Sn$) (Tc=17.5° K). Weak dielectric material 304 may be constructed using a dielectric with a low dielectric constant (k) value.

Weak dielectric material 304 may be constructed using a material that (1) has non-zero resistance in the "off" state, (2) can be turned "on" by using a low current/low voltage or a low laser pulse intensity, and (3) that does not revert to an "off" state on its own. In some embodiments, the weak dielectric material 304 may also be desired to be reversible or reprogrammable. Weak dielectric material 304 may be turned "on" by exposing weak dielectric material 304 to electromagnetic radiation having an intensity greater than a threshold intensity, applying a voltage greater than a threshold voltage across weak dielectric material 304, or passing a current greater than a threshold current through weak dielectric material 304. In some embodiments, the "on/off" behavior of weak dielectric material 304 may be reversed by reversing the current/field through the fuse. Weak dielectric material 304 may exhibit non-zero impedance in the unprogrammed state (i.e., "off" state), and a zero resistance in the programmed state (i.e., "on" state) below a critical temperature. Specifically, a dielectric material with a dielectric constant k between 2.5 to 3 may be used (a low dielectric constant material may break down when a low voltage is applied across the material and/or a low current is passed through the material).

In some embodiments, CMOS circuitry that is built into the substrate may be used to program the superconducting anti-fuse based FPGA. In these embodiments, the CMOS circuitry may be designed to deliver a voltage or current that is sufficient (i.e., that is greater than a threshold voltage or current) to "fuse" the anti-fuse to an "on" state, i.e., a state that exhibits superconductivity at temperatures less than the critical temperature of the superconducting material that is used to construct the anti-fuse. In other embodiments, the programming may be performed by SCE circuitry (instead of CMOS circuitry).

In some embodiments described herein, programmability may be performed at room temperature. Specifically, some embodiments described herein may use lasers to program the superconducting anti-fuse based FPGA. For example, an anti-fuse map may be generated by synthesizing a design, and performing placement and routing. The anti-fuse map may indicate which anti-fuses in the superconducting anti-fuse based FPGA are to be programmed. Next, a laser may be used to target the anti-fuses, thereby programming the superconducting anti-fuse based FPGA.

In some embodiments, the CMOS programming circuitry may be embedded in the substrate and connections between the CMOS programming circuitry and the SCE circuitry may be realized using vias or through-silicon vias (TSVs). In some embodiments, the CMOS programming circuitry may be used for a one-time programming of the anti-fuses, and the CMOS programming circuitry may be disabled thereafter to avoid interfering with the normal operation of the SCE circuitry.

Figure 4:
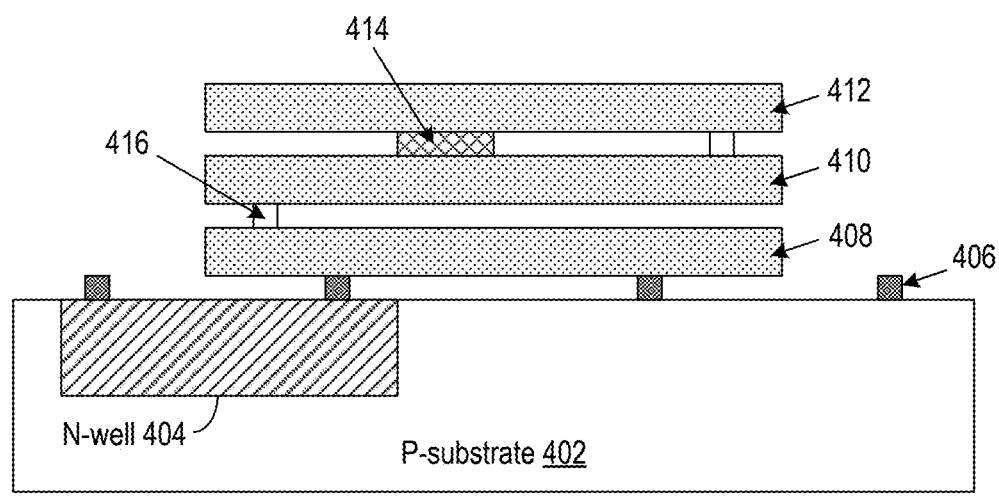
FIG. 4 illustrates a cross-section of a CMOS substrate below the superconducting circuitry in accordance with some embodiments described herein.

FIG. 4 illustrates a cross-section of a CMOS substrate below the superconducting circuitry in accordance with some embodiments described herein.

CMOS circuitry may be constructed in p-substrate 402. Specifically, n-devices may be constructed in p-substrate 402 and p-devices may be constructed in n-well 404. Contacts (e.g., contact 406) may be used to electrically connect terminals of n-devices and p-devices to metal routes on metal layer 408. Metal layer 410 may include a first set of PTLs (e.g., first set of PTLs 108 in FIG. 1), and metal layer 412 may include a second set of PTLs (e.g., second set of PTLs 110 in FIG. 1). Anti-fuse 414 may be used to electrically connect a first PTL in the first set of PTLs on metal layer 410 with a second PTL in the second set of PTLs on metal layer 412. Superconducting circuitry may be created on one or more metal layers above metal layer 412 (not shown in FIG. 4). Vias (e.g., via 416) may be used to electrically connect the CMOS circuitry with the superconducting circuitry. The cross-section illustrated in FIG. 4 is for illustration purposes and is not intended to limit the scope of the disclosed embodiments.

Some embodiments may include a memory stack. Specifically, some embodiments may include (in addition to the circuitry for implementing anti-fuse programmable FPGAs) CMOS dynamic random-access memory (DRAM) or static random-access memory (SRAM) or non-volatile memory (NVM). An example of an NVM may include spin-transfer torque magnetoresistive random-access memory STT-MRAM. JJ based memories, such as magnetic tunnel junction (MTJ) based memories may also be present. Also, JJ based memories constructed from simple shift-register arrays, which may be anti-fused configured for generic usage such as memory caching operations. These memory blocks may be configured using the anti-fuses. In some embodiments, the memory stack may be constructed using III-V semiconductor technology, which includes, but is not limited to, indium phosphide (InP), indium arsenide (InAs), gallium arsenide (GaAs), gallium nitride (GaN), and indium animonide (InSb) semiconductor technology. In some embodiments, the memory stack may be constructed using heterojunction bipolar transistor technology.

Some embodiments may include input/output (I/O) blocks. Examples of I/O blocks include, but are not limited to, (1) high-voltage (40-80 mv) latching-generated JJ signals for driving room-temperature electronics, (2) optical drivers/receivers, such as VCSEL (vertical cavity surface emitting laser) output cells and single-photon detectors, and (3) multiplexers/demultiplexers, serializers/deserializers, etc., for wide-bandwidth transmission.

In some embodiments, the interconnects may be generic and may be used for signal delivery, power network, and clock delivery. In some embodiments, separate tracks and/or separate interconnects may be dedicated for signal delivery, power delivery, and clock delivery. In some embodiments, a clock tree may be pre-laid out in parallel with module placement. In some embodiments, a power delivery network may be pre-laid out in parallel with module placement.

Figure 5:
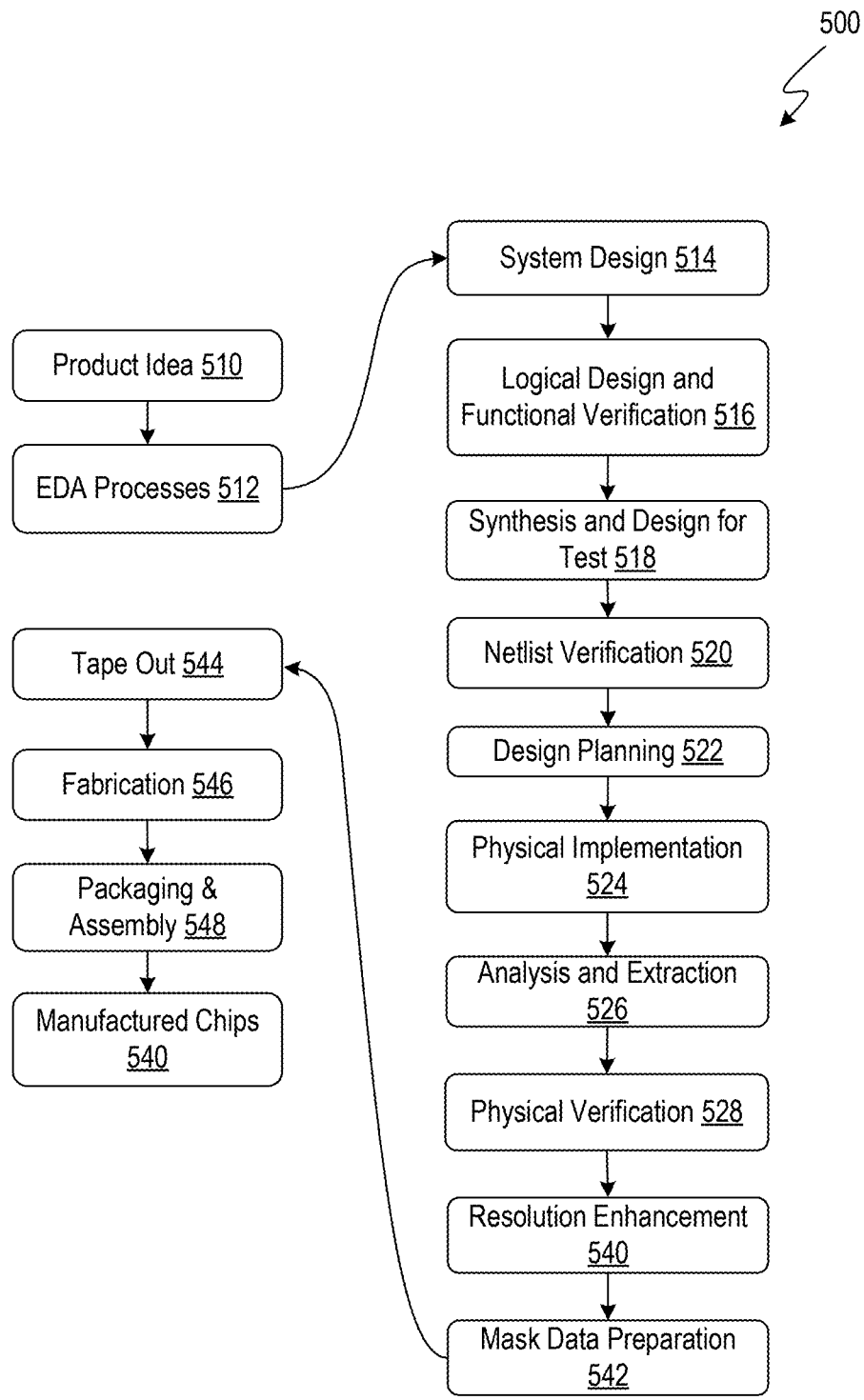
FIG. 5 illustrates an example flow for the design, verification, and fabrication of an integrated circuit in accordance with some embodiments described herein.

FIG. 5 illustrates an example flow for the design, verification, and fabrication of an integrated circuit in accordance with some embodiments described herein. EDA processes 512 (the acronym "EDA" refers to "Electronic Design Automation") can be used to transform and verify design data and instructions that represent the integrated circuit. Each of these processes can be structured and enabled as multiple modules or operations.

Flow 500 can start with the creation of a product idea 510 with information supplied by a designer, information which is transformed and verified by using EDA processes 512. When the design is finalized, the design is taped-out 544, which is when artwork (e.g., geometric patterns) for the integrated circuit is sent to a fabrication facility to manufacture the mask set, which is then used to manufacture the integrated circuit. After tape-out, a semiconductor die is fabricated 546 and packaging and assembly 548 are performed to produce the manufactured IC chip 540.

Specifications for a circuit or electronic structure may range from low-level transistor material layouts to high-level description languages. A high-level of representation may be used to design circuits and systems, using a hardware description language ("HDL") such as VHDL, Verilog, SystemVerilog, SystemC, MyHDL or Open Vera. The HDL description can be transformed to a logic-level register transfer level ("RTL") description, a gate-level description, a layout-level description, or a mask-level description. Each lower representation level that is a more concrete description that adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 540, the geometry of the layout is transformed to improve how the circuit design is manufactured.

During tape-out, data is created to be used (after lithographic enhancements are applied if appropriate) for production of lithography masks. During mask data preparation 542, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
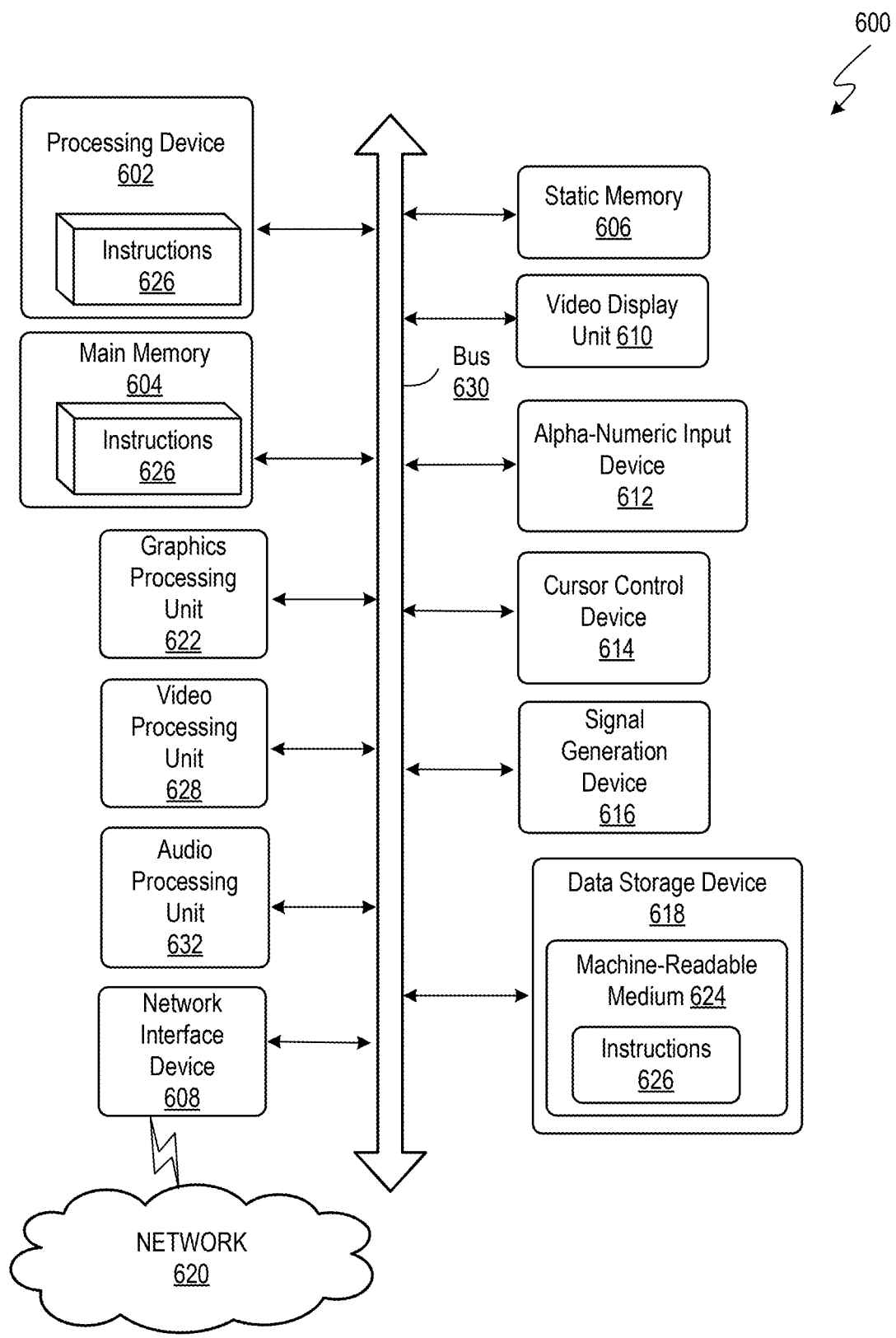
FIG. 6 illustrates an example machine of a computer system within which a set of instructions, for causing the machine to perform any one or more of the methodologies discussed herein, may be executed.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A structure, comprising:
a first metal layer, a second metal layer, a third metal layer, and a fourth metal layer arranged sequentially in a direction away from a semiconductor layer, wherein the first metal layer, the second metal layer, the third metal layer, and the fourth metal layer are different from one another;
wherein the fourth metal layer includes a set of active superconducting components;
wherein the second metal layer includes a first set of superconducting passive transmission lines (PTLs), wherein a first superconducting passive transmission line (PTL) in the first set of superconducting PTLs connects a first PTL driver with a first PTL receiver which are disposed on the fourth metal layer, wherein the first PTL driver drives the first superconducting PTL with a non-single-flux-quantum-pulse, and wherein the first PTL receiver converts the non-single-flux-quantum pulse received over the first superconducting PTL into a single-flux-quantum pulse;
wherein the third metal layer includes a second set of superconducting PTLs, wherein a second superconducting PTL in the second set of superconducting PTLs connects a second PTL driver with a second PTL receiver which are disposed on the fourth metal layer;
at least one anti-fuse located at an intersection of a third superconducting PTL from the first set of superconducting PTLs and a fourth superconducting PTL from the second set of superconducting PTLs, wherein the at least one anti-fuse is located between the second metal layer and the third metal layer, wherein a first terminal of the anti-fuse is electrically connected to the third superconducting PTL and a second terminal of the anti-fuse is electrically connected to the fourth superconducting PTL, wherein the anti-fuse has a first state which is an unprogrammed state and a second state which is a programmed state, wherein the anti-fuse has a non-zero resistance above and below a critical temperature in the first state, wherein the anti-fuse has a non-zero resistance above the critical temperature and a zero resistance below the critical temperature in the second state, wherein the anti-fuse comprises two superconducting structures separated by a dielectric material, and wherein the dielectric material is insulating in the first state and superconducting in the second state;
wherein the semiconductor layer includes a complementary metal-oxide-semiconductor (CMOS) circuit to transition the anti-fuse from the first state to the second state; and
wherein the first metal layer provides connectivity between devices in the CMOS circuit.

2. The structure of claim 1, wherein the anti-fuse can transition from the first state to the second state but cannot transition from the second state to the first state.

3. The structure of claim 1, wherein the anti-fuse can transition from the first state to the second state, and from the second state to the first state.

4. The structure of claim 1, wherein the anti-fuse transitions from the first state to the second state when the anti-fuse is exposed to electromagnetic radiation having an intensity greater than a threshold intensity.

5. The structure of claim 1, wherein the anti-fuse transitions from the first state to the second state when a voltage greater than a threshold voltage is applied across the anti-fuse.

6. The structure of claim 1, wherein the anti-fuse transitions from the first state to the second state when a current greater than a threshold current is passed through the anti-fuse.

7. The structure of claim 1, wherein the two superconducting structures are made of: niobium, lead, aluminum, sodium-lead alloy, tantalum carbide, niobium carbide, lead-arsenic alloy, lead-tin-bismuth alloy, lead-arsenic-bismuth alloy, lead-bismuth-antimony alloy, magnesium di-boride, niobium-tin, yttrium barium copper oxide, a high temperature superconducting material, or any material that exhibits superconductive behavior below a given critical temperature.

8. The structure of claim 1, wherein the set of active superconducting components is arranged in rows on the fourth metal layer.

9. The structure of claim 8, wherein the rows are separated by channels.

10. The structure of claim 8, wherein the first set of superconducting passive transmission lines, the second set of superconducting passive transmission lines, and the at least one anti-fuse are used to electrically connect inputs and outputs of the set of active superconducting components.

11. The structure of claim 1, comprising a CMOS memory circuit.

12. The structure of claim 8, wherein an active superconducting component comprises one or more of: a passive transmission line receiver, a passive transmission line driver, combinational logic that uses superconducting electronics, sequential logic that uses superconducting electronics, Josephson Junction (JJ) based superconducting quantum interference (SQUID) devices, and JJ based memory arrays.

13. The structure of claim 8, comprising a circuit constructed using III-V semiconductor technology or heterojunction bipolar transistor technology.

14. The structure of claim 1, wherein the dielectric material has a dielectric constant between 2.5 and 3.

15. A superconducting anti-fuse based field programmable gate array (FPGA), comprising:
a first metal layer, a second metal layer, a third metal layer, and a fourth metal layer arranged sequentially in a direction away from a semiconductor layer, wherein the first metal layer, the second metal layer, the third metal layer, and the fourth metal layer are different from one another;
wherein the fourth metal layer includes a set of active superconducting components;
wherein the second metal layer includes a first set of superconducting passive transmission lines (PTLs), wherein a first superconducting passive transmission line (PTL) in the first set of superconducting PTLs connects a first PTL driver with a first PTL receiver which are disposed on the fourth metal layer, wherein the first PTL driver drives the first superconducting PTL with a non-single-flux-quantum-pulse, and wherein the first PTL receiver converts the non-single-flux-quantum pulse received over the first superconducting PTL into a single-flux-quantum pulse;
wherein the third metal layer includes a second set of superconducting PTLs, wherein a second superconducting PTL in the second set of superconducting PTLs connects a second PTL driver with a second PTL receiver which are disposed on the fourth metal layer;
at least one anti-fuse located at an intersection of a third superconducting PTL from the first set of superconducting PTLs and a fourth superconducting PTL from the second set of superconducting PTLs, wherein the at least one anti-fuse is located between the second metal layer and the third metal layer, wherein a first terminal of the anti-fuse is electrically connected to the third superconducting PTL and a second terminal of the anti-fuse is electrically connected to the fourth superconducting PTL, wherein the anti-fuse has a first state which is an unprogrammed state and a second state which is a programmed state, wherein the anti-fuse has a non-zero resistance above and below a critical temperature in the first state, wherein the anti-fuse has a non-zero resistance above the critical temperature and a zero resistance below the critical temperature in the second state, wherein the anti-fuse comprises two superconducting structures separated by a dielectric material, and wherein the dielectric material is insulating in the first state and superconducting in the second state;
wherein the semiconductor layer includes a complementary metal-oxide-semiconductor (CMOS) circuit to transition the anti-fuse from the first state to the second state; and
wherein the first metal layer provides connectivity between devices in the CMOS circuit.

16. The superconducting anti-fuse based FPGA of claim 15, wherein the dielectric material has a dielectric constant between 2.5 and 3.

17. An apparatus, comprising:
a first metal layer, a second metal layer, a third metal layer, and a fourth metal layer arranged sequentially in a direction away from a semiconductor layer, wherein the first metal layer, the second metal layer, the third metal layer, and the fourth metal layer are different from one another;
wherein the second metal layer includes a first set of superconducting passive transmission lines (PTLs), wherein a first superconducting passive transmission line (PTL) in the first set of superconducting PTLs connects a first PTL driver with a first PTL receiver which are disposed on the fourth metal layer, wherein the first PTL driver drives the first superconducting PTL with a non-single-flux-quantum-pulse, and wherein the first PTL receiver converts the non-single-flux-quantum pulse received over the first superconducting PTL into a single-flux-quantum pulse;
wherein the third metal layer includes a second set of superconducting PTLs, wherein a second superconducting PTL in the second set of superconducting PTLs connects a second PTL driver with a second PTL receiver which are disposed on the fourth metal layer;
at least one anti-fuse located at an intersection of a third superconducting PTL from the first set of superconducting PTLs and a fourth superconducting PTL from the second set of superconducting PTLs, wherein the at least one anti-fuse is located between the second metal layer and the third metal layer, wherein a first terminal of the anti-fuse is electrically connected to the third superconducting PTL and a second terminal of the anti-fuse is electrically connected to the fourth superconducting PTL, wherein the anti-fuse has a first state which is an unprogrammed state and a second state which is a programmed state, wherein the anti-fuse has a non-zero resistance above and below a critical temperature in the first state, wherein the anti-fuse has a non-zero resistance above the critical temperature and a zero resistance below the critical temperature in the second state, wherein the anti-fuse comprises two superconducting structures separated by a dielectric material, and wherein the dielectric material is insulating in the first state and superconducting in the second state;

wherein the fourth metal layer includes a set of active superconducting components arranged in rows;

wherein the semiconductor layer includes a memory circuit;

wherein the semiconductor layer includes a complementary metal-oxide-semiconductor (CMOS) circuit to transition the antifuse from the first state to the second state; and wherein the first metal layer provides connectivity between devices in the CMOS circuit.

18. The apparatus of claim 17, wherein the dielectric material has a dielectric constant between 2.5 and 3.

* * * * *